United States Patent
Plisson

(10) Patent No.: US 10,728,592 B2
(45) Date of Patent: Jul. 28, 2020

(54) AUDIO DECODING AND READING SYSTEM

(71) Applicant: Damien Plisson, Paris (FR)

(72) Inventor: Damien Plisson, Paris (FR)

( * ) Notice: Subject to any disclaimer, the term of this patent is extended or adjusted under 35 U.S.C. 154(b) by 48 days.

(21) Appl. No.: 16/321,272

(22) PCT Filed: Jul. 5, 2017

(86) PCT No.: PCT/FR2017/051834
§ 371 (c)(1),
(2) Date: Jan. 28, 2019

(87) PCT Pub. No.: WO2018/024953
PCT Pub. Date: Feb. 8, 2018

(65) Prior Publication Data
US 2019/0174154 A1    Jun. 6, 2019

(30) Foreign Application Priority Data
Aug. 4, 2016 (FR) .................... 16 57555

(51) Int. Cl.
H04N 7/00       (2011.01)
H04N 21/2368    (2011.01)
G11C 7/16       (2006.01)
G10L 19/16      (2013.01)
G06F 3/16       (2006.01)
(Continued)

(52) U.S. Cl.
CPC ......... H04N 21/2368 (2013.01); G06F 3/162 (2013.01); G10L 19/008 (2013.01); G10L 19/167 (2013.01); G11C 7/16 (2013.01); G11B 2020/10546 (2013.01)

(58) Field of Classification Search
CPC combination set(s) only.
See application file for complete search history.

(56) References Cited

U.S. PATENT DOCUMENTS 6,920,526 B1      7/2005  Sikkink et al.
2010/0142927 A1 * 6/2010  Lim ................... H04N 21/2368
                                                       386/239

FOREIGN PATENT DOCUMENTS

EP    1 445 698 A1    8/2004
WO    2016/156702 A1  10/2016

OTHER PUBLICATIONS

Plisson, "Audirvana Plus 2.0 User Manual," Sep. 25, 2014, retrieved from internet website: https://web.archive.org/web/20140925073951/http://audirvana.com/delivery/AudirvanaPlusUserManual.pdf on Dec. 9, 2016, 39 pages.

(Continued)

Primary Examiner — Amir H Etesam
(74) Attorney, Agent, or Firm — Faegre Drinker Biddle & Reath LLP

(57) ABSTRACT

An audio decoding and reading system comprises a computing module, a high-fidelity module, and a buffer-memory assembly which is between the computing module and the high-fidelity module. The buffer-memory assembly is intended to store a sliding segment of a digital audio stream which is transmitted by the computing module to the high-fidelity module. In this manner, a speed of processing of said digital audio stream by a digital-to-analog converter of the high-fidelity module, can be independent of a speed of production of said digital audio stream by the computing module. An improved sound emission quality results from this decoupling.

12 Claims, 1 Drawing Sheet

(51) Int. Cl.
*G10L 19/008* (2013.01)
*G11B 20/10* (2006.01)

(56) References Cited

OTHER PUBLICATIONS

Sells et al., "Naim DAC White Paper," Aug. 1, 2009, retrieved from internet website: http://www.auditionveritable.com/pdf/Livre_blanc_du_DAC_de_Naim.pdf on Dec. 9, 2016, pp. 1-12.

\* cited by examiner

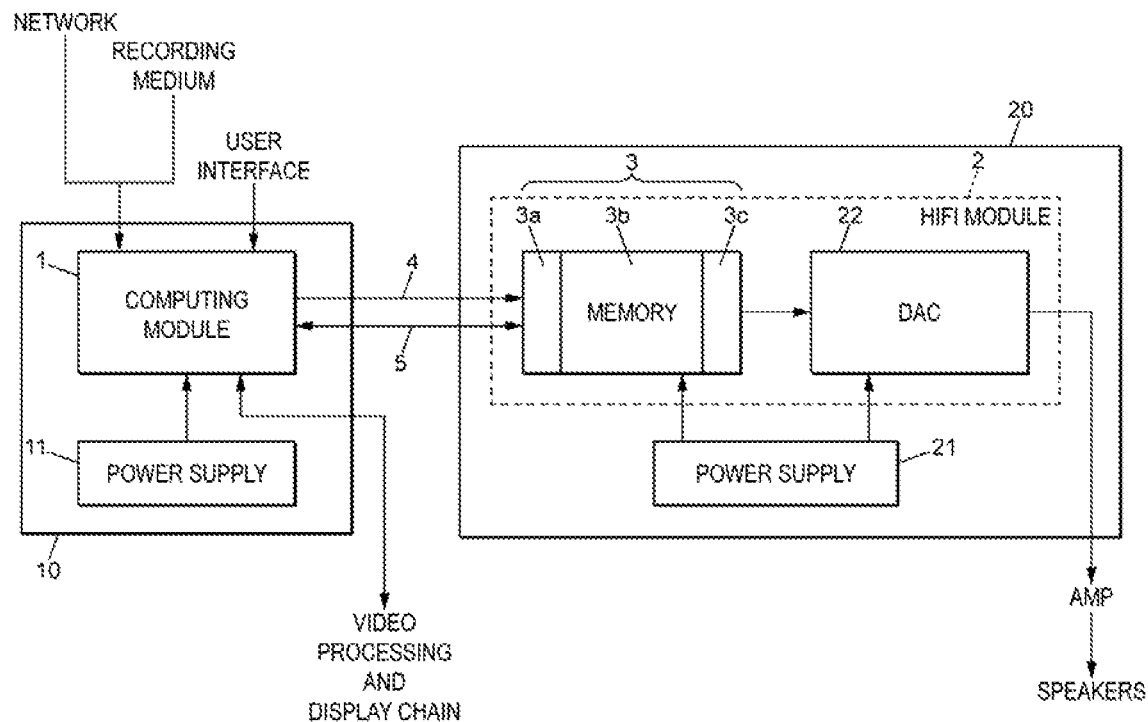

AUDIO DECODING AND READING SYSTEM

CROSS-REFERENCE TO RELATED APPLICATIONS

This application is the U.S. national phase of the International Patent Application No. PCT/FR2017/051834 filed Jul. 5, 2017, which claims the benefit of French Application No. 16 57555 filed Aug. 4, 2016, the entire content of which is incorporated herein by reference.

FIELD

The disclosure relates to an audio decoding and reading system.

BACKGROUND

Such a system usually comprises:
a computing module, which is suitable for:
- receiving audio files from an external source or reading audio files from a recording medium that is connected to the computing module, the audio files being encoded in accordance with a file format, called computer processing format, that is suitable for applying computer processing to them and for performing operations on data contained in these audio files,
- generating at least one digital audio stream that is in accordance with a digital audio stream format, from at least one audio file that is received or read in the computer processing format, and
- receiving use commands that are entered by means of a user interface, and which determine system settings or steps of an operating sequence of the system; and
a high-fidelity (hifi) module, which comprises a digital-to-analog converter and which is suitable for producing an analog sound emission signal from the digital audio stream, and this high-fidelity module is further adapted to execute some of the use commands.

In systems of this type that are known from the prior art, the computing module may actually be a microcomputer that controls the high-fidelity module. The digital audio stream is transmitted by the computing module to the high-fidelity module either by a synchronous link or by an asynchronous link with transmission of small data packets. The use of a synchronous link can thus be in accordance with one of the standards such as S/PDIF, I2S, AES/EBU for example, but in general, a synchronous link has rate fluctuations for the data stream that is transmitted. These rate fluctuations, called "jitter", can result from fluctuations in the clock periodicity of the computing module, but also from fluctuations in a reference voltage used to detect changes of values in the data that is transmitted. Indeed, such a reference voltage is obtained from a supply voltage, which itself can vary with random power draws, particularly when several modules consuming electrical power are supplied in parallel by the same power supply unit.

When an asynchronous link, for example USB audio, is used between the computing module and the high-fidelity module, an additional link which is again of the synchronous type is then used in the high-fidelity module between the USB interface of the module and the digital-to-analog converter. The disadvantage of rate fluctuation in a synchronous link is therefore still present.

Irregularities in the transmission rate of the digital audio stream, between the computing module and the digital-to-analog converter, degrade the analog sound emission signal that is sent to an amplifier and then to speakers. The sound quality as perceived by the user is thus degraded.

Another cause of degradation in the sound quality perceived by the user is the existence of electromagnetic interference which is picked up by the transmission link between the computing module and the high-fidelity module. This phenomenon is commonly called the antenna effect, and may also occur within the high-fidelity module or downstream of it.

There are existing circuits that reduce the transmission rate fluctuations of a stream and the antenna effects which were described above. Such circuits are incorporated into the high-fidelity module of an audio decoding and reading system, between the link transmitting the digital audio stream from the computing module and the digital-to-analog converter. However, such additional circuits are complex and expensive. In addition, they require the consumption of additional electricity, and are therefore in turn likely to cause electromagnetic interference and voltage fluctuations within the high-fidelity module.

SUMMARY

Considering this situation, the disclosure provides a new architecture for audio decoding and reading systems which do not have the above disadvantages. In particular, the disclosure aims to improve the sound quality which can be provided by an audio decoding and reading system without significantly increasing its complexity or its price.

To achieve this or other objects, an embodiment provides an audio decoding and reading system which comprises a computing module and a high-fidelity module as described above, but which further comprises:
- a buffer-memory assembly, which is arranged to store at least one segment of the digital audio stream which is produced by the computing module,
- a writing assembly, which is arranged to receive the digital audio stream produced by the computing module and to write this digital audio stream into the buffer-memory assembly, and
- a reading assembly, which is arranged to read the digital audio stream from the buffer-memory assembly, and to transmit the digital audio stream so read to the digital-to-analog converter.

According to a further feature of an embodiment, the reading assembly is further adapted to allow a variable delay between a writing of data of the digital audio stream by the writing assembly into the buffer-memory assembly, and a subsequent reading of the same data of the digital audio stream from the buffer-memory assembly, such that an instantaneous transfer rate of the reading is independent of an instantaneous transfer rate of the writing.

The buffer-memory assembly that is introduced by an embodiment allows decoupling the speed at which the digital audio stream intended for the high-fidelity module is read, from the speed at which this digital audio stream was previously stored in the buffer-memory assembly. Thus, variations in the writing speed, due in particular to fluctuations in the transmission rate between the computing module and a writing assembly which is dedicated to storing data in the buffer-memory assembly, are absorbed by a variable length of the digital audio stream segment that is contained at each moment in the buffer-memory assembly. The speed at which the digital audio stream is read from the buffer-memory assembly can then be driven by the high-fidelity module without being subject to rate fluctuations and to electromagnetic interference in the transmission from the computing module. The reading speed and the rate at which the digital-to-analog converter is fed the digital audio stream can thus have a much greater regularity. The quality of the sound emission enabled by such an audio decoding and reading system is improved accordingly.

Furthermore, a buffer-memory assembly according to an embodiment is less expensive and consumes less electrical power than circuits for reducing transmission rate fluctuations and for reducing antenna effects. In addition, the buffer-memory, reading, and writing assemblies generate less electromagnetic interference, and also result in less random power draws from a power supply unit.

The buffer-memory assembly may be included in the high-fidelity module, but this is not necessary. In particular, it may be a separate additional module, which is between a link for transmitting the digital audio signal originating from the computing module, and an input of the high-fidelity module.

Moreover, the user interface that is used to enter the use commands of the audio decoding and reading system is not necessarily part of the system itself. Indeed, it may be an external interface, in particular a multi-purpose interface such as a universal remote control or an input terminal which is connected by a transmission network to the audio decoding and reading system. In particular, it may be a tablet computer connected by Wifi or Bluetooth to the audio decoding and reading system.

Preferably, the audio decoding and reading system according to an embodiment may be further adapted so that the instantaneous transfer rate of the reading of the digital audio stream in the buffer-memory assembly is controlled internally within the high-fidelity module, according to criteria for supplying the digital-to-analog converter with this digital audio stream, or criteria relating to the sound emission.

Preferably also, the format of the digital audio stream, as written and then read in the buffer-memory assembly, may be the format used by the digital-to-analog converter within the high-fidelity module for performing a conversion from digital format to analog format, in order to produce the analog sound emission signal.

In particular, it is advantageous that no transformation operation on the digital audio stream which is likely to cause variable delays in the processing of this stream, and/or that would be burdensome to achieve and/or would itself cause parasitic interference and fluctuations in a reference voltage used, is carried out after the digital audio stream is read from the buffer-memory assembly. Such transformation operations on the digital audio stream, such as changing the sampling frequency of the sound emission signal, or changing the type of audio modulation, for example from pulse code modulation (PCM) to direct stream digital (DSD) or the reverse, are therefore advantageously executed in the computing module.

In certain embodiments, the buffer-memory assembly may be of circular buffer type. In other embodiments, it may comprise two blocks of memory that are separate and controlled so that writing operations are carried out in one of the blocks and reading operations are carried out in the other block during one same period of time, then the blocks are exchanged for the reading and writing operations during a subsequent period of time.

Preferably, the buffer-memory assembly may have sufficient capacity to store a digital audio stream segment corresponding to a sound emission of a duration that is greater than 1 second, preferably greater than 5 seconds, or even greater than 10 seconds.

The computer processing format for the audio files may be one of the following: WAV, AIFF, FLAC, WavPack, Apple Lossless, AAC, MP3, Ogg Vorbis, WMA, Monkey's Audio APE, DTS including its successive versions, Dolby Digital or AC-3 including its successive versions such as Dolby TrueHD, Dolby Atmos, DTS:X, MQA, DFS, DSDIFF, SACD, and DVD-Audio.

In first improvements of an embodiment which are intended to reduce parasitic interference between the computing module and the high-fidelity module, the buffer-memory assembly and the digital-to-analog converter may be independent of a first circuit board on which the computing module is at least partially implemented. In this case, an output of the computing module is connected to an input of the writing assembly by a link for transmitting the digital audio stream. The system also comprises means for transmitting at least some of the use commands to the high-fidelity module. Preferably for such improvements, the buffer-memory assembly and the digital-to-analog converter may be at least partly implemented in a second circuit board which is separate from the first circuit board, and which is shared by the buffer-memory assembly and the digital-to-analog converter.

In second improvements of an embodiment which are also intended to reduce the parasitic interference between the computing module and the high-fidelity module, the buffer-memory assembly and the digital-to-analog converter may be contained in an electromagnetically shielding housing. The computing module is then located outside this housing.

In third improvements of an embodiment intended to reduce the crosstalk that may occur across the power supply to the modules, the system may further comprise at least one power supply unit which is dedicated to the reading assembly and to the digital-to-analog converter while being isolated from the computing module, and another power supply unit which is dedicated to the computing module.

Furthermore, in general, the high-fidelity module may further be adapted for transmitting to the computing module at least one of: information on a status of a processing of the digital audio stream by this high-fidelity module, a message to acknowledge receipt of a change in audio sampling frequency, a message to acknowledge receipt of a change in audio sampling depth, a message to acknowledge receipt of a change in modulation format or a change in encoding format of the digital audio stream, a message indicating a space which is available in the buffer-memory assembly for writing a next part of the digital audio stream, a message to acknowledge receipt of a use command, and information about the state of execution of a use command. In this case, the audio decoding and reading system of an embodiment may be coupled to a video decoding and reading system. The high-fidelity module is then adapted for transmitting, in particular to the computing module, information on the status of the processing of the digital audio stream by the high-fidelity module. Then, at least one among the audio decoding and reading system and the video decoding and reading system can be adapted for adjusting a synchronization between the sound emission that is produced from the analog sound emission signal, and images that are displayed from video display data produced by the video decoding and reading system.

BRIEF DESCRIPTION OF THE DRAWINGS

Other features and advantages will be apparent from the description below of an exemplary non-limiting embodiment, with reference to the following accompanying drawing:

FIG. 1 is a general diagram of an audio decoding and reading system according to an embodiment.

DETAILED DESCRIPTION

Modules and components of the audio decoding and reading system which are known to the skilled person and are not directly concerned with an embodiment are not represented or described in the following. However, it is understood that such modules and components may be included in the embodiment now described, and for the numeric values and parameters of the system that are used without being modified by the embodiment.

References 1 and 2 respectively denote the computing module and the high-fidelity module. Although it is optional in the embodiment, the modules 1 and 2 are supplied with electrical power from two separate power supply units, denoted ALIM: unit 11 for the computing module 1 and unit 21 for the high-fidelity module 2. In addition, when the modules 1 and 2 are each implemented on a circuit board or boards which is/are separate from the board(s) of the other module, each module 1 and 2 may be enclosed in a housing, that insulates against interfering electromagnetic radiation, which is dedicated to this module. The computing module 1 may thus be housed within a housing 10, and the high-fidelity 2 module may be housed within a separate housing 20.

The computing module 1 can receive audio files that are encoded in a computer processing format, from multiple sources such as a local storage medium or remote sources connected to the computing module by a transmission network. The format of the audio files that are received or read by the computing unit 1 may be WAV, AIFF, FLAC, WavPack, Apple Lossless, AAC, MP3, Ogg Vorbis, WMA, Monkey's Audio APE, DTS including its successive versions, Dolby Digital or AC-3 including its successive versions such as Dolby TrueHD, Dolby Atmos, DTS:X, MQA, DFS, DSDIFF, SACD, and DVD-Audio, these being non-limiting, and is referred to as the computer processing format for audio files in the general part of the present description. The computing module 1 applies processing to this (these) audio file(s) that is known to those skilled in the art, to produce a digital audio stream which corresponds, in digital format, to the sound signal to be produced. This processing which is performed by the computing module 1 may include a conversion of the sampling frequency of the sound emission signal, called the audio sampling frequency, and/or a conversion of the depth of this sampling, or even of the modulation format of the digital audio stream. Sampling depth refers to the number of bits which constitute the level of digitization of the amplitude of the sound emission signal. Other examples of processing that may be carried out by the computing module 1 on the audio file(s) in the computer processing format or on the digital audio stream, are acoustic correction filtering as applied by equalizers, convolution filtering and other filtering to improve the sound emission signal as perceived by a listener while potentially taking into account the impact of the playback system downstream, including the amplifier and speakers, as well as the acoustics of the listening room.

In addition, the computing module 1 receives commands from a user, called use commands, which concern the desired operation of the system: commands to turn on, turn off, pause, commands to select music pieces, to change the playback position, commands to adjust the sound level, etc. These commands can be entered by the user via a user interface, which can be dedicated to the audio decoding and reading system, such as a keyboard or input table, or may be a multi-purpose input terminal such as a tablet computer. Some of the use commands may be intended for the computing module 1, such as commands for selecting or scheduling music pieces, while other use commands may be intended for the high-fidelity module 2, as such controls for adjusting the sound level. Other commands may concern both the computing module 1 and the high-fidelity module 2.

In a known manner, the high-fidelity module 2, also called the hi-fi module, comprises a digital-to-analog converter 22, denoted CNA, which converts the digital audio stream into an analog sound emission signal. This analog sound emission signal is then sent to an amplifier and then to one or more speaker(s) in order to produce the sound emission. Although it is not shown, the high-fidelity module 2 may have several parallel audio channels (several separate channels in the case of a stereo system, bass channel . . . ), each channel having its own digital-to-analog converter.

A transmission link 4, which may be synchronous or asynchronous, transmits the digital audio stream from an output of the computing module 1 to the high fidelity module 2.

According to an embodiment, an intermediate storage unit 3 is inserted in the digital audio stream transmission path between the computing module 1 and the digital-to-analog converter 22. Possibly, but not necessarily, this intermediate storage unit 3 may be included in the high-fidelity module 2. It has a writing assembly 3a at its input, which is intended to write the digital audio stream in a buffer-memory assembly 3b as this stream is transmitted by the computer unit 1 via the transmission link 4. Simultaneously, the intermediate storage unit 3 comprises a reading assembly 3c, which is intended to read the digital audio stream in the buffer-memory assembly 3b as this stream is processed by the digital-to-analog converter 22. Thus, the high-fidelity module 2 can control the rate of conversion of the digital audio stream into an analog sound emission signal, independently of the rate at which the writing assembly 3a is fed by the computing unit 1. The operations of the writing assembly 3a and reading assembly 3c are independent, and a sliding segment of the digital audio stream is present in the buffer-memory assembly 3b at every moment. This digital audio stream segment has an instantaneous length which is unrestricted, or with minimum restrictions so that it essentially varies with the instantaneous speed of reception of the stream from the computer unit 1, and the instantaneous speed of processing of the same stream by the digital-to-analog converter 22. In other words, the instantaneous speed of reception of the digital audio stream coming from the computing unit 1 has very little or no influence on the instantaneous speed of processing of the digital-to-analog converter 22. The latter speed can then be controlled by the high-fidelity unit 2 according to a nominal rate of the digital-to-analog converter 22, or to reproduce a nominal speed of sound emission. For this, the capacity of the buffer-memory assembly 3b is preferably sufficient to contain the accumulated differences between instantaneous reading and writing speeds that could occur during entire pieces of music. For example, the capacity of the buffer-memory assembly 3b can be sized to contain 1 second, or even 5 or 10 seconds, of a piece of music.

To allow simultaneous writing and reading, the intermediate storage unit 3 may comprise one or more modules which are each of the circular buffer type. Alternatively, the buffer-memory assembly 3b may comprise two independent blocks of memory which alternate in being used one exclusively for writing, the other exclusively for reading, then the use for writing and reading are exchanged between the two blocks of memory; this occurs repeatedly or periodically throughout a sequence of decoding and reading a same sound emission piece. Depending on the structure used for the intermediate storage unit 3, the writing assembly 3a may comprise one or more writing units, and the reading assembly 3c may comprise one or more reading units. It is also possible for the digital audio stream to be written and read in the buffer-memory assembly 3b by the writing assembly 3a and by the reading assembly 3c respectively, in the form of successive blocks that can have any length, equal or different between reading and writing. Possible block lengths are, for example, 2 or 3 kilobytes for writing, and reading can be carried out with blocks of 1, 16, or 24 bits depending on the sampling depth. Use of such intermediate storage units, including coordination between write and read addresses related to the release of storage space once reading has occurred, is assumed to be known to the skilled person and is not repeated here.

Reference 5 in the figure indicates a two-way transmission of operations data between the computing module 1 and the high-fidelity module 2. In the direction from the computing module 1 to the high-fidelity module 2, these operations data include the use commands already mentioned above, and informational messages concerning changes in sampling rate, changes in sampling depth and/or modulation format that are applied to the digital audio stream. For the transmission in the opposite direction, from high-fidelity module 2 to computing module 1, the operations data that are transmitted may include information on the status of processing the digital audio stream by the high-fidelity module 2, or more specifically by the converter 22, messages to acknowledge receipt of changes in the sampling frequency, sampling depth, and/or modulation format that have been previously specified by the computing module 1 to the high-fidelity module 2, messages indicating space that is available in the buffer-memory assembly 3b, messages possibly for controlling adjustments to the speed of transmission of the next part of the digital audio stream by the transmission link 4, messages to acknowledge receipt of use commands previously transmitted by the computing module 1 to the high fidelity module 2, information concerning the state of execution of a use command, etc.

It is possible for the audio decoding and reading system just described to constitute the audio portion of an audio and video decoding and reading device. Such a combination device thus further includes a video processing and display chain, commonly called the video channel. Such a video channel itself comprises a video decoding and reading system for supplying a display system with a steam of images to be successively displayed. Part of the computing module 1 may then be shared with the video channel, particularly for the reception of audio/video files and the reception of use commands. Then, the transmission 5 can also be used for the two-way transmission of synchronization tags or messages to control the advancement of the sound emission and the video display relative to another.

It is understood that embodiments disclosed can be reproduced while modifying secondary aspects of the embodiment. In particular, the separation of the computing and high-fidelity modules to separate circuit boards, and/or separate housings, and/or with power supply units that are separate, are advantageous but optional improvements. Also optionally, the reading assembly and the digital-to-analog converter may be supplied by two separate power supply units.

The invention claimed is:

1. An audio decoding and reading system, comprising:
   a computing module, suitable for:
      receiving audio files from an external source or reading audio files from a recording medium that is connected to said computing module, said audio files being encoded in accordance with a file format, called computer processing format, that is suitable for applying computer processing to said audio files and for performing operations on data contained in said audio files,
      generating at least one digital audio stream that is in accordance with a digital audio stream format, from at least one audio file received or read in the computer processing format, and
      receiving use commands entered by means of a user interface, which determine system settings or steps of an operating sequence of said system; and
   a high-fidelity module, which comprises a digital-to-analog converter and which is suitable for producing an analog sound emission signal from the digital audio stream, and said high-fidelity module being further adapted to execute some of the use commands,
   wherein the system further comprises:
   a buffer-memory assembly, which is arranged to store at least one segment of the digital audio stream produced by the computing module,
   a writing assembly, which is arranged to receive the digital audio stream produced by the computing module and to write said digital audio stream into the buffer-memory assembly, and
   a reading assembly, which is arranged to read the digital audio stream from the buffer-memory assembly, and to transmit the digital audio stream so read to the digital-to-analog converter,
   and the reading assembly is further adapted to allow a variable delay between a writing of data of the digital audio stream by the writing assembly into the buffer-memory assembly, and a subsequent reading of said data of the digital audio stream from said buffer-memory assembly, such that an instantaneous transfer rate of the reading is independent of an instantaneous transfer rate of the writing.

2. The system according to claim 1, adapted so that the instantaneous transfer rate of the reading of the digital audio stream from the buffer-memory assembly is controlled internally within the high-fidelity module, according to criteria for supplying the digital-to-analog converter with said digital audio stream, or criteria relating to the sound emission.

3. The system according to claim 1, wherein the format of the digital audio stream, as written and then read in the buffer-memory assembly, is used by the digital-to-analog converter within the high-fidelity module for performing conversion from digital format to analog format, in order to produce the analog sound emission signal.

4. The system according to claim 1, wherein the buffer-memory assembly is of circular buffer type, or the buffer-memory assembly comprises two blocks of memory that are separate and controlled so that writing operations are carried out in one of the blocks and reading operations are carried out in the other block during one same period of time, then the blocks are exchanged for the reading and writing operations during a subsequent period of time.

5. The system according to claim 1, wherein the buffer-memory assembly has sufficient capacity to store a digital audio stream segment corresponding to a sound emission of a duration that is greater than 1 sec, preferably greater than 5 seconds, or even greater than 10 seconds.

6. The system according to claim 1, wherein the computer processing format for the audio files is one of the following formats: WAV, AIFF, FLAC, WavPack, Apple Lossless, AAC, MP3, Ogg Vorbis, WMA, Monkey's Audio APE, DTS, Dolby Digital or AC-3 including its versions Dolby TrueHD, Dolby Atmos, DTS:X, MQA, DFS, DSDIFF, SACD, and DVD-Audio.

7. The system according to claim 1, wherein the buffer-memory assembly and the digital-to-analog converter are independent of a first circuit board on which the computing module is at least partially implemented,
   an output of the computing module is connected to an input of the writing assembly by a link for transmitting the digital audio stream, and
   the system further comprises means for transmitting at least some of the usage commands to the high-fidelity module.

8. The system according to claim 7, wherein the buffer-memory assembly and the digital-to-analog converter are at least partly implemented in a second circuit board which is separate from said first circuit board, and which is shared by the buffer-memory assembly and the digital-to-analog converter.

9. The system according to claim 1, wherein the buffer-memory assembly and the digital-to-analog converter are contained in an electromagnetically shielding housing, and the computing module is located outside said housing.

10. The system according to claim 1, further comprising at least one power supply unit which is dedicated to the reading assembly and to the digital-to-analog converter while being isolated from the computing module, and another power supply unit which is dedicated to said computing module.

11. The system according to claim 1, wherein the high-fidelity module is further adapted for transmitting to the computing module at least one of: information on a status of a processing of the digital audio stream by said high-fidelity module, a message to acknowledge receipt of a change in audio sampling frequency, a message to acknowledge receipt of a change in audio sampling depth, a message to acknowledge receipt of a change in modulation format or encoding format of the digital audio stream, a message indicating a space available in the buffer-memory assembly for writing a next part of the digital audio stream, a message to acknowledge receipt of a use command, and information about the state of execution of a use command.

12. The audio decoding and reading system according to claim 11, coupled to a video decoding and reading system, wherein the high-fidelity module is further adapted for transmitting, to the computing module, information on the status of the processing of the digital audio streams by said high-fidelity module, and wherein at least one among the audio decoding and reading system and the video decoding and reading system is adapted for adjusting a synchronization between the sound emission that is produced from the analog sound emission signal, and images that are displayed from video display data produced by the video decoding and reading system.

* * * * *